(12) United States Patent
Breil et al.

(10) Patent No.: US 9,335,759 B2
(45) Date of Patent: May 10, 2016

(54) OPTIMIZATION OF A LASER ANNEAL BEAM PATH FOR MAXIMIZING CHIP YIELD

(71) Applicant: GLOBALFOUNDRIES INC., Grand Cayman (KY)

(72) Inventors: Nicolas L. Breil, Wappingers Falls, NY (US); Oleg Gluschenkov, Tannersville, NY (US); Keith Kwong Hon Wong, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 173 days.

(21) Appl. No.: 14/177,260

(22) Filed: Feb. 11, 2014

(65) Prior Publication Data

US 2015/0227137 A1    Aug. 13, 2015

(51) Int. Cl.
*G06F 17/50* (2006.01)
*G05B 19/418* (2006.01)

(52) U.S. Cl.
CPC ...... *G05B 19/41865* (2013.01); *G05B 2219/45032* (2013.01); *Y02P 90/02* (2015.11); *Y02P 90/20* (2015.11)

(58) Field of Classification Search
USPC ............... 716/51, 52, 54, 55, 56, 136, 132
See application file for complete search history.

(56) References Cited

U.S. PATENT DOCUMENTS

| | | | |
|---|---|---|---|
| 5,113,072 A | 5/1992 | Yamaguichi et al. | |
| 6,420,264 B1 | 7/2002 | Talwar et al. | |
| 6,972,268 B2 | 12/2005 | Ehrmann et al. | |
| 7,374,955 B2 | 5/2008 | Izumome | |
| 8,105,445 B2 | 1/2012 | Klosterman et al. | |
| 8,188,447 B2 | 5/2012 | Yang et al. | |
| 2002/0192914 A1 | 12/2002 | Kizilyalli et al. | |
| 2005/0199597 A1* | 9/2005 | Tsao | B23K 26/03 219/121.66 |
| 2009/0267200 A1* | 10/2009 | Gutt | H01L 21/26513 257/655 |
| 2011/0214101 A1* | 9/2011 | Cheng | G06F 17/5036 716/136 |
| 2011/0298156 A1 | 12/2011 | Hooper et al. | |
| 2013/0061196 A1* | 3/2013 | Cheng | G06F 17/5068 716/132 |
| 2014/0131723 A1* | 5/2014 | Hawryluk | H01L 33/32 257/76 |
| 2015/0171017 A1* | 6/2015 | Evans | H01L 23/544 438/799 |

* cited by examiner

*Primary Examiner* — Brian Ngo
(74) *Attorney, Agent, or Firm* — Scully, Scott, Murphy & Presser, P.C.

(57) ABSTRACT

Semiconductor chips with curable out of specification measured values of an anneal-activated parameter are identified at a test step. A plurality of anneal plans are generated to include at least one of the identified semiconductor chips. A net yield improvement is calculated for each anneal plan. Each anneal plan includes the paths of a laser beam across the wafer to be irradiated, and optionally includes an azimuthal angle of the wafer as a function of time. The net yield improvement is the difference between an estimated yield improvement from selected target semiconductor chips for irradiation and an estimated yield loss due to collateral irradiation of functional semiconductor chips for each anneal plan. After simulating the net yield improvements for all the anneal plans, the anneal plan providing the greatest net yield improvement can be selected and utilized.

20 Claims, 10 Drawing Sheets

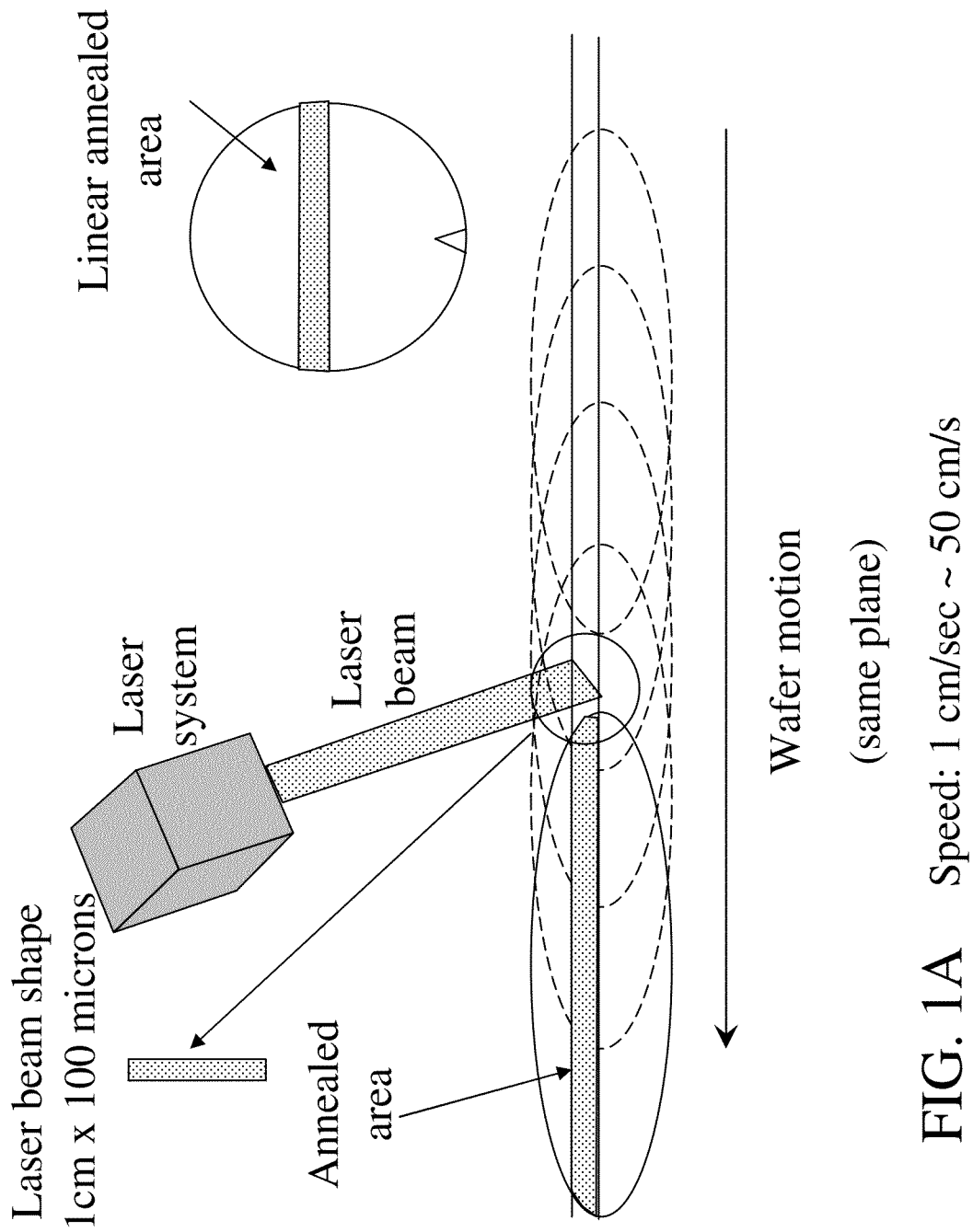
FIG. 1A  Speed: 1 cm/sec ~ 50 cm/s

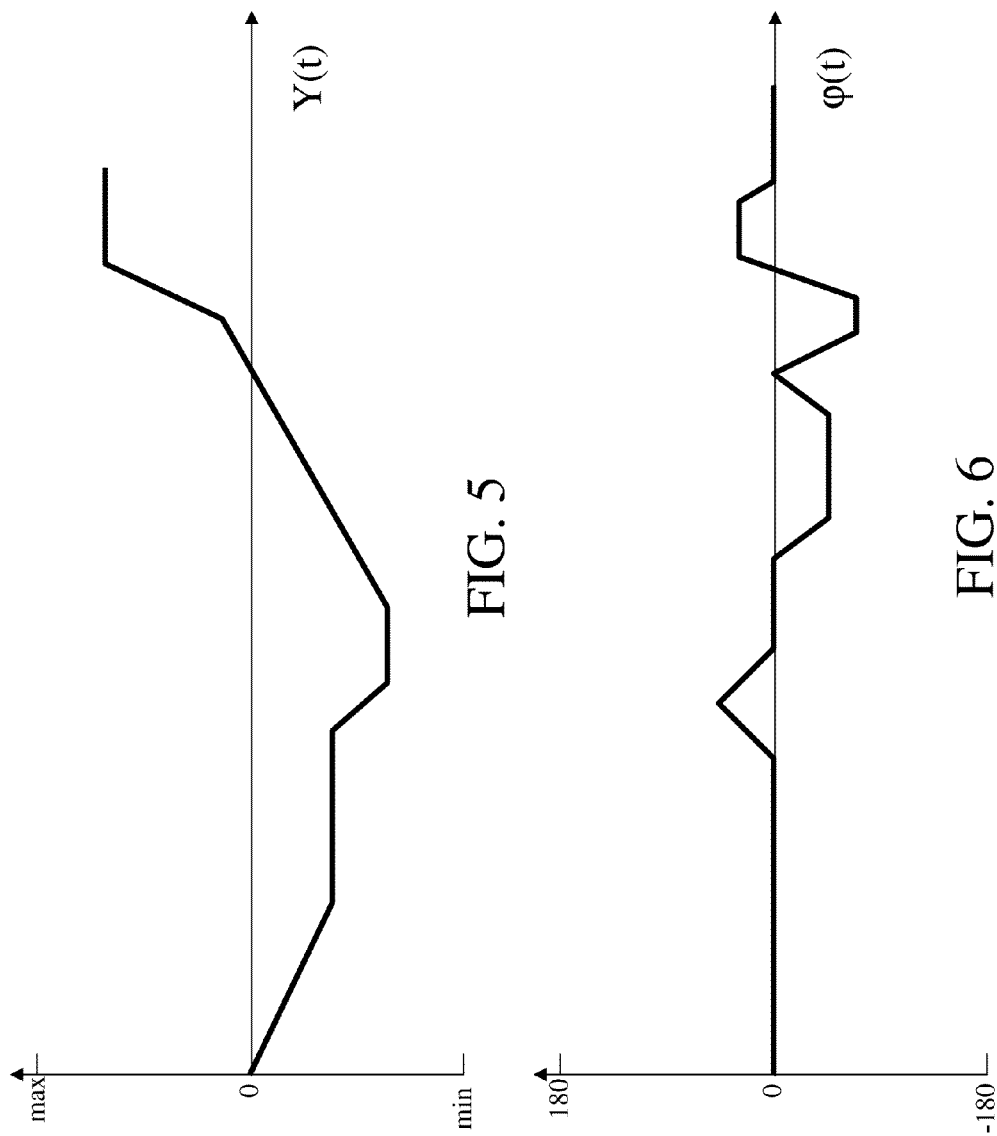

OPTIMIZATION OF A LASER ANNEAL BEAM PATH FOR MAXIMIZING CHIP YIELD

BACKGROUND

The present invention relates to methods and systems for analyzing and improving the net chip yield from a wafer by optimizing a laser anneal path in semiconductor manufacturing.

The chip yield for a wafer refers to the percentage of functional semiconductor chips on the wafer to the total number of semiconductor chips on the wafer. The chip yield can be estimated by measuring various test macros that are incorporated into each semiconductor chip by design, and can be tested at various test levels during manufacturing. The test macros provide reliable estimates of various processing parameters that are indicative of functionality of each semiconductor chip.

Some of the processing parameters measure anneal-activated parameters. An "anneal-activated" parameter refers to a measurable parameter that requires an anneal process in order to achieve a target value. For example, anneal-activated parameters include post-anneal sheet resistance of a metal silicide film, post-anneal sheet resistance of various doped semiconductor region, and leakage current measurement for gate dielectrics or node dielectrics. A measured value for an anneal-activated parameter within a target range at a test step is indicative of functionality of a semiconductor chip as far as the anneal-activated parameter is concerned.

SUMMARY

Semiconductor chips with curable out of specification measured values of an anneal-activated parameter are identified at a test step. A plurality of anneal plans are generated to include at least one of the identified semiconductor chips. A net yield improvement is calculated for each anneal plan. Each anneal plan includes the paths of a laser beam across the wafer to be irradiated, and optionally includes an azimuthal angle of the wafer as a function of time. The net yield improvement is the difference between an estimated yield improvement from selected target semiconductor chips for irradiation and an estimated yield loss due to collateral irradiation of functional semiconductor chips in the vicinity, or the path, of a laser beam for each anneal plan. After simulating the net yield improvements for all the anneal plans, the anneal plan providing the greatest net yield improvement can be selected and utilized.

According to an aspect of the present disclosure, a method of determining an anneal method to be performed on a substrate including a plurality of semiconductor chips is provided. Data for in-substrate chip coordinates and measured values of an anneal-activated parameter is provided for a plurality of semiconductor chips on a semiconductor substrate to a computing means that includes one or more processors in communication with memory. A plurality of anneal plans for a laser anneal for the semiconductor substrate is generated. Each of the anneal plans includes a simulated path for a laser beam to impinge on a corresponding set of target semiconductor chips and collaterally irradiated additional semiconductor chips during transit of the laser beam between target semiconductor chips. Each set of target semiconductor chips is a subset selected from a set of all semiconductor chips in the semiconductor substrate having measured values for the anneal-activated parameter within a predetermined subset of out of specification ranges. Employing the computing means, an estimated net yield enhancement is simulated for each of the plurality of anneal plans. The estimated net yield enhancement is a difference between a total number of estimated changes from an out of specification value to an in-specification value for the anneal-activated parameter less a total number of estimated changes from an in-specification value to an out of specification value for the anneal-activated parameter according to a corresponding anneal plan among the plurality of anneal plans. An anneal plan that provides a greatest value for the estimated net yield enhancement is determined.

According to another aspect of the present disclosure, a system is provided for determining an anneal method to be performed on a substrate including a plurality of semiconductor chips. The system includes computing means including one or more processors in communication with memory, and is configured to perform processing steps that include a processing step of receiving data for in-substrate chip coordinates and measured values of an anneal-activated parameter for a plurality of semiconductor chips on a semiconductor substrate, and a processing step of generating a plurality of anneal plans for a laser anneal for the semiconductor substrate. Each of the anneal plans includes a simulated path for a laser beam to impinge on a corresponding set of target semiconductor chips and collaterally irradiated additional semiconductor chips during transit of the laser beam between target semiconductor chips. Each set of target semiconductor chips is a subset selected from a set of all semiconductor chips in the semiconductor substrate having measured values for the anneal-activated parameter within a predetermined subset of out of specification ranges. The processing steps further include a step of simulating an estimated net yield enhancement for each of the plurality of anneal plans. The estimated net yield enhancement is a difference between a total number of estimated changes from an out of specification value to an in-specification value for the anneal-activated parameter less a total number of estimated changes from an in-specification value to an out of specification value for the anneal-activated parameter according to a corresponding anneal plan among the plurality of anneal plans. Further, the processing steps include a step of determining an anneal plan that provides a greatest value for the estimated net yield enhancement.

BRIEF DESCRIPTION OF SEVERAL VIEWS OF THE DRAWINGS

FIG. 1A illustrates how a linear area within a substrate may be annealed employing a laser beam according to an embodiment of the present disclosure.

FIG. 5 illustrates an exemplary Cartesian y-coordinate function according to an embodiment of the present disclosure.

FIG. 6 illustrates an exemplary substrate azimuthal angle function according to an embodiment of the present disclosure.

DETAILED DESCRIPTION

Figure 1B:
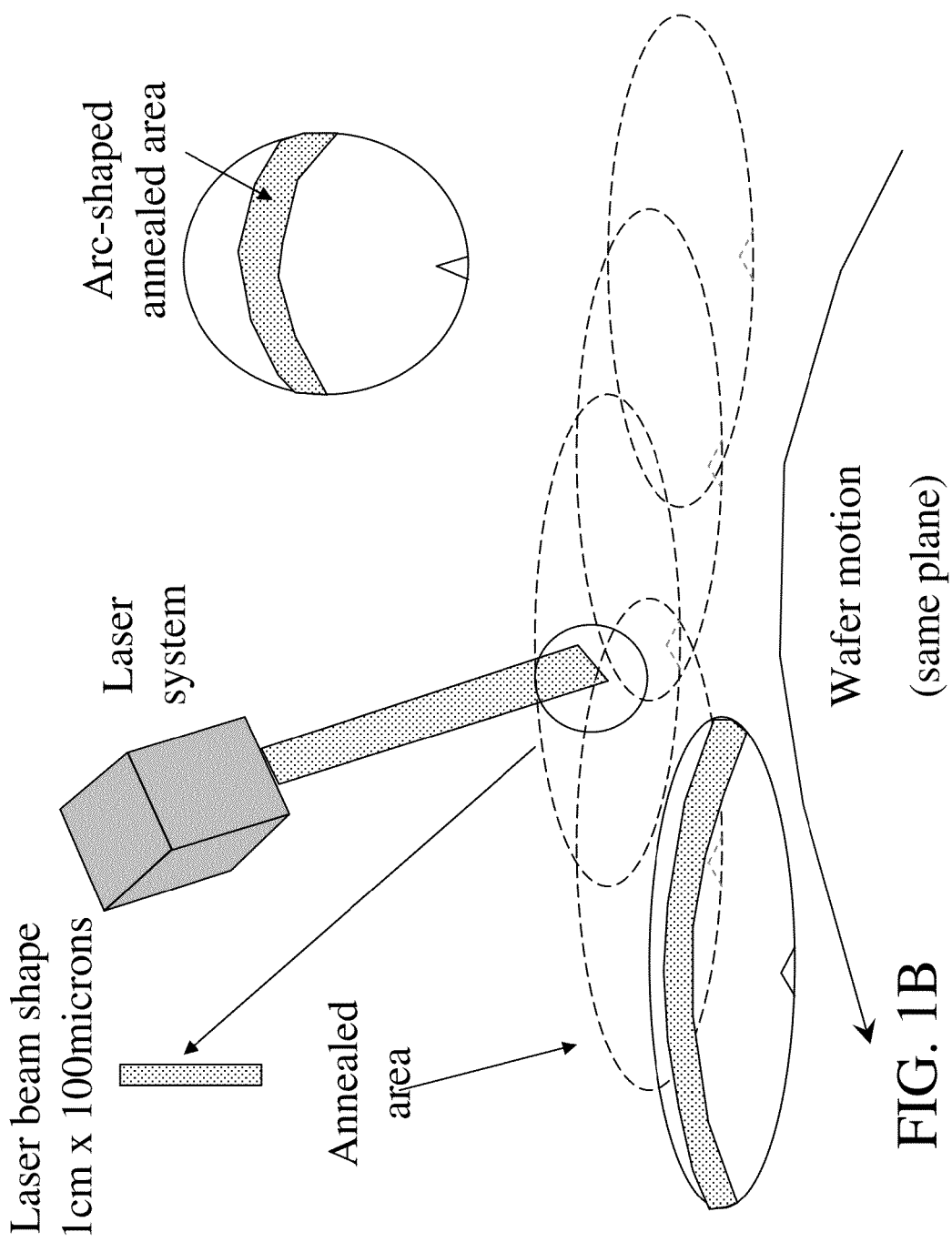
FIG. 1B illustrates how an arc-shaped area within a substrate may be annealed employing a laser beam according to an embodiment of the present disclosure.

As stated above, the present invention relates to methods and systems for analyzing and improving the net chip yield from a wafer by optimizing a laser anneal path in semiconductor manufacturing. Aspects of the present disclosure are now described in detail with accompanying figures. Like and corresponding elements are referred to by like reference numerals. The drawings are not necessarily drawn to scale.

Referring to FIG. 1A, a method of annealing a contiguous path having a same width on a semiconductor substrate is illustrated. A laser system configured to emit a laser beam having a finite beam width and a finite beam length is provided. The finite beam width may be in a range from 30 microns to 300 microns, and the finite beam length may be in a range from 300 microns to 3 cm, although lesser and greater widths and lengths can also be employed. In FIG. 1A, a laser beam having a beam width of 100 microns and a beam length of 1 cm is illustrated.

A guided motion is induced on a semiconductor substrate (i.e., a semiconductor wafer) including semiconductor chips therein across the path of the laser beam at a scan speed, which can be, for example, in a range from 1 cm/sec to 50 cm/sec, although lesser and greater scan speeds can also be employed. The motion of the semiconductor substrate can be confined within a Euclidean plane. The irradiated area of the semiconductor substrate can be a linear area having a same width as the length of the laser beam.

Referring to FIG. 1B, an annealed contiguous area can be in the shape of an arc, or in general, a curvilinear shape having an arbitrary curvature. The movement of the semiconductor substrate can be in the shape of an arc, or in general, a curvilinear path. The irradiated area of the semiconductor substrate can be an arc-shaped area having a same width as the length of the laser beam, or in general, a contiguous shape of arbitrary shape provided that the shape is a strip having a uniform width.

Figure 2:
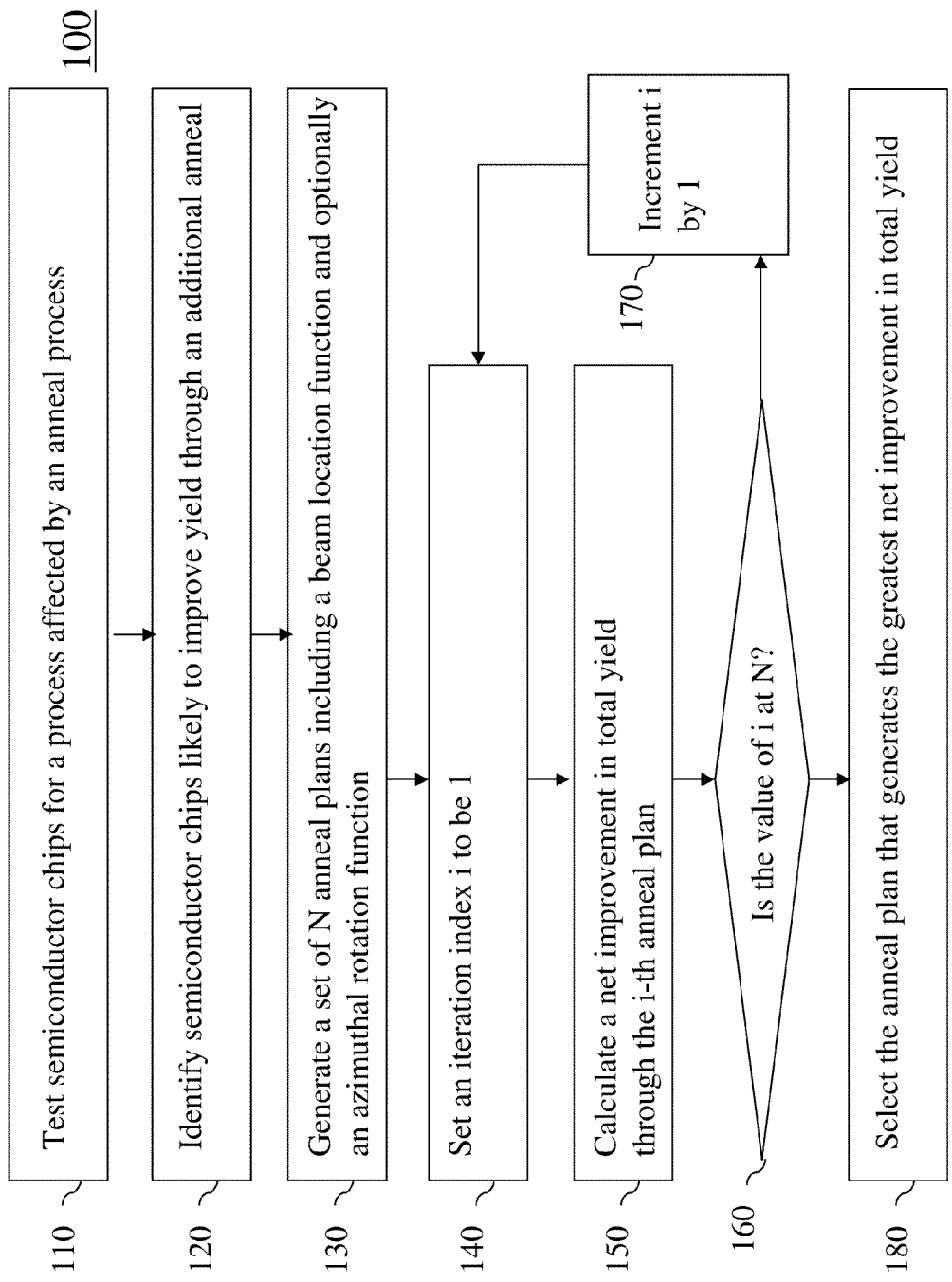
FIG. 2 illustrates a flow chart illustrating exemplary processing steps for determining an optimal anneal plan according to an embodiment of the present disclosure.

Referring to FIG. 2, a flow chart 100 illustrates exemplary processing steps for determining an optimal anneal plan for a substrate including a plurality of semiconductor chips for the purpose of maximizing the chip yield for an anneal-activated parameter. Each anneal plan defines the location and the path of a laser beam to be employed to provide a curative thermal anneal on a selected set of semiconductor chips and additional optional parameters. The optimal anneal plan can provide the best combination of the location and the path of the laser beam and any additional parameters as obtained from a simulation.

If at least one semiconductor chip in the semiconductor substrate has an out of specification measured value for the anneal-activated parameter, a curative thermal anneal may be performed employing a laser spot anneal tool for a selected subset of semiconductor chips having out of specification values for an anneal-activated parameter. As used herein, an out of specification value refers to a value that is outside the range for the specification for functionality of semiconductor chips regarding the anneal-activated parameter. A plurality of semiconductor chips can have out of specification values for the anneal-activated parameter upon a first testing after a processing step designed to provide a suitable anneal to cause the anneal-activated parameter to be within the target specification range. In this case, the out of specification values can further be changed to values within the specification upon a further anneal, which is herein referred to as a curative anneal, that is performed selectively only on the set of out of specification semiconductor chips or a subset thereof. For example, if the post-anneal sheet resistance of a metal silicide film is too high after the first testing, an additional anneal can lower the post-anneal sheet resistance to a value within the specification for the semiconductor chips having out of specification values for the post-anneal sheet resistance as measured at a test step after a silicide anneal process step.

Semiconductor chips having such out of specification values for an anneal-activated parameter are typically scattered within a wafer. At the same time, a laser beam for performing the curative thermal anneal cannot be instantly switched on or off as the laser beam moves across the various semiconductor chips on the wafer. As a result, collateral exposure to the laser beam occurs around, and between, the target semiconductor chips for laser irradiation. Such collateral exposure to functional semiconductor chips, i.e., semiconductor chips having in-spec values for the anneal-activated parameter, can degrade the yield of the collaterally irradiated functional semiconductor chips. Thus, a systematic method is desired for determining which semiconductor chips should be cured with a curative thermal anneal and which path the laser beam should take.

According to an aspect of the present disclosure, a systematic method for determining the path of a laser beam to be employed to perform a curative anneal is provided. Referring to step 110, semiconductor chips on a semiconductor substrate are tested for an anneal-activated parameter, i.e., a measurable parameter that requires an anneal process in order to achieve a target value. The anneal-activated parameter can be, for example, post-anneal sheet resistance of a metal silicide film, post-anneal sheet resistance of various doped semiconductor region, or leakage current for gate dielectrics or node dielectrics.

Referring to step 120, a system for determining an anneal method to be performed on a substrate including a plurality of semiconductor chips is employed. The system includes computing means including one or more processors in communication with memory and configured to various processing steps. The computing means can be a computer or any other electronic device configured to run an automated program including instructions for performing the various processing steps.

At a first processing step, data for in-substrate chip coordinates and measured values of an anneal-activated parameter is provided for a plurality of semiconductor chips on a semiconductor substrate to the computing means. The data for the in-substrate chip coordinates and the measured values of the anneal-activated parameter can be generated from a tester for testing semiconductor chips. The computing means is configured, through the automated program, to receive the data as transmitted from the tester or through any intermediary computing means, which can be a remote server or a data storage device on a cloud computing system that stores the data from the tester.

A set of semiconductor chips that are likely to improve yield through an additional anneal, i.e., a curative anneal by a localized laser beam, is identified based on the test data received by the computing means. The set of semiconductor chips includes all semiconductor chips in the semiconductor substrate having measured values for the anneal-activated parameter within a predetermined subset of out of specification ranges. For example, the predefined subset of out of specification ranges can be a set of values that is less than the target specification range for the anneal-activated parameter, or can be a set of values that is greater than the target specification range for the anneal-activated parameter.

In an illustrative example, if the target specification range for a post-anneal sheet resistance for a metal silicide film is from 2 Ohms/square to 5 Ohms/square, the entire range of the out of specification values include the range from 0 Ohm to 2 Ohm and the range from 5 Ohm to infinity. A curative anneal typically lowers the sheet resistance even further. Thus, it would be difficult to bring a semiconductor chip with a measured value of the post-anneal sheet resistance of 1.9 Ohm/square within the target specification range through a curative anneal. In contrast, a semiconductor chip having a measured value of the post-anneal sheet resistance marginally exceeding 5 Ohms/square may be cured into a functional semiconductor chip having an in-specification value for the sheet resistance upon a curative anneal. For example, a predefined subset of the out of specification ranges can be, for example, a range from 5 Ohm/square to 8 Ohm/square.

In general, the set of semiconductor chips having measured values of the anneal-activated parameter within the predefined subset of the out of specification ranges is the set of semiconductor chips that are likely to improve yield through the curative anneal. Thus, the predefined subset of the out of specification ranges is a range of values for the anneal-activated parameter indicating that the corresponding semiconductor chip may be rendered functional if a curative anneal is performed, for example, by a laser anneal.

Figure 3A:
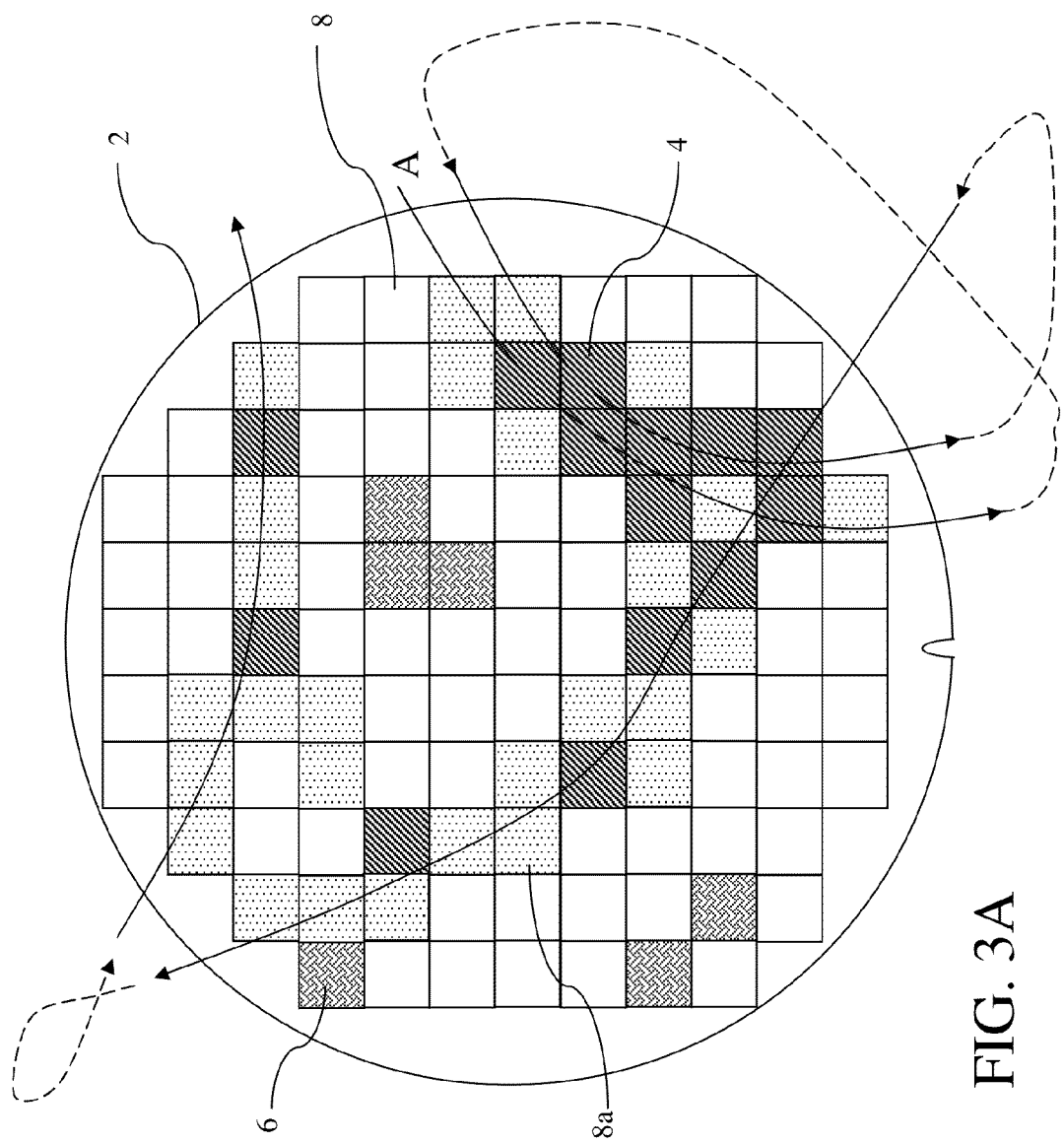
FIG. 3A is a top-down view of a semiconductor substrate including semiconductor chips on which measurements have been made for an anneal-activated parameter according to an embodiment of the present disclosure. Various types of semiconductor chips and a first exemplary simulated path A for a laser beam are illustrated.
Figure 3B:
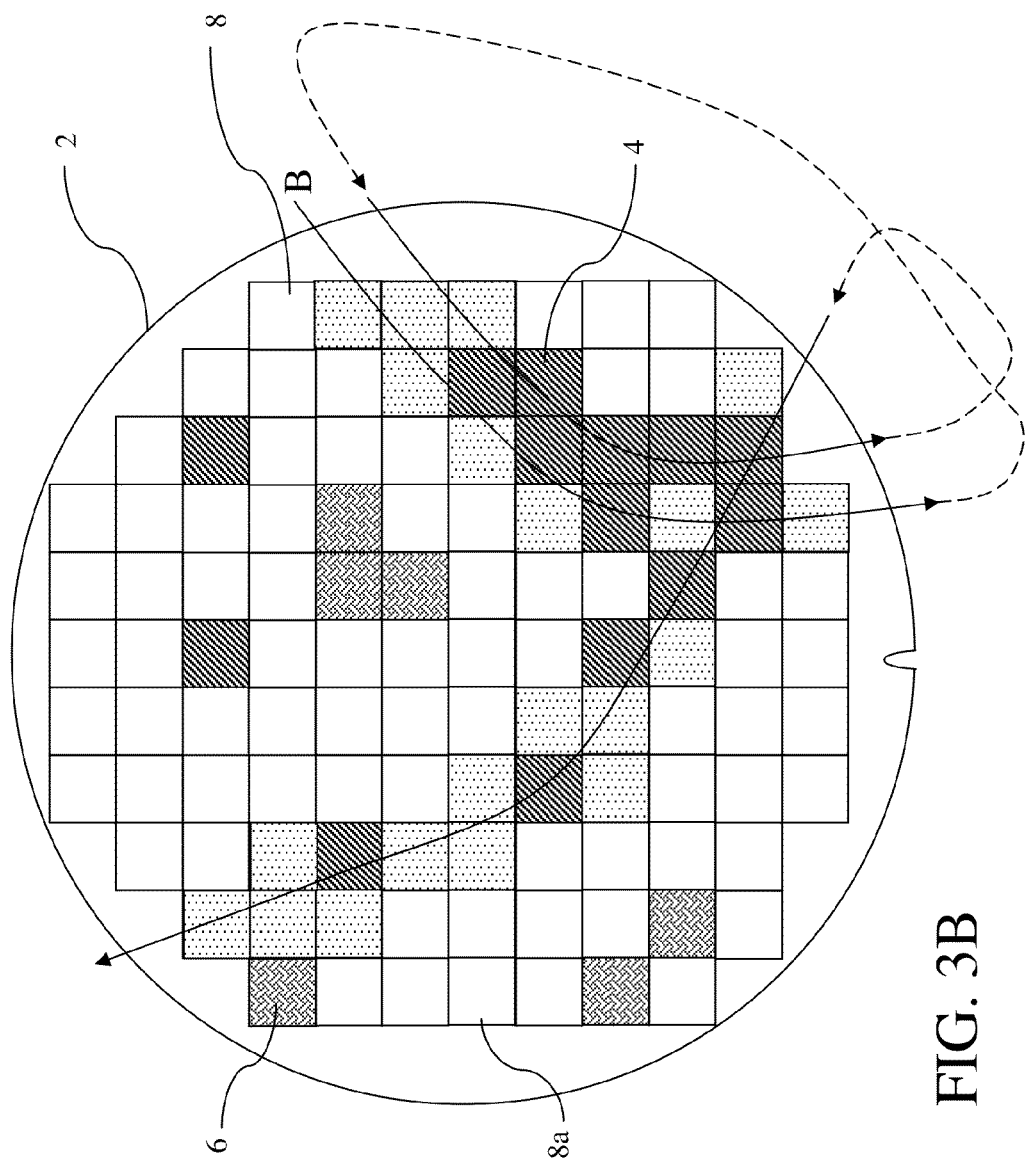
FIG. 3B is a top-down view of a semiconductor substrate including semiconductor chips on which measurements have been made for an anneal-activated parameter according to an embodiment of the present disclosure. Various types of semiconductor chips and a second exemplary simulated path B for a laser beam are illustrated.

FIGS. 3A and 3B show a semiconductor substrate 2 including semiconductor chips on which measurements have been made for the anneal-activated parameter. The semiconductor chips on the semiconductor substrate 2 include in-specification semiconductor chips 8 that have measured values for the anneal-activated parameter within the target specification range. A first exemplary simulated path A is illustrated in FIG. 3A, and a second exemplary simulated path B is illustrated in FIG. 3B.

Further, the semiconductor chips on the semiconductor substrate 2 include annealable semiconductor chips 4. As used herein, an "annealable semiconductor chip" refers to a semiconductor chip having measured values of the anneal-activated parameter within the predefined subset of the out of specification ranges, and thus, may benefit from a curative anneal employing a localized laser beam. The annealable semiconductor chips 4 are the semiconductor chips that can potentially become a target of laser irradiation during a laser anneal with a reasonable expectation of improvement in the chip yield.

Further, the semiconductor chips on the semiconductor substrate 2 can include incurable semiconductor chips 6, which are semiconductor chips that have measured values of the anneal-activated parameter outside the target specification range for the anneal-activated parameter and outside the predefined subset of the out of specification ranges. The incurable semiconductor chips 6 are expected to be non-functional due to the properties correlated with the measured out of specification values for the anneal-activated parameter, and is expected to remain non-functional even if a curative anneal were to be attempted thereupon. Thus, the automated program excludes the incurable semiconductor chips 6 from a list of semiconductor chips to be annealed in a curative anneal process.

Referring to step 130 of the flow chart 100 in FIG. 2, the automated program can generated a plurality of anneal plans for a laser anneal for the semiconductor substrate 2. The total number of the anneal plans is herein referred to as an integer N, which is greater than 1. If the total number of annealable semiconductor chips 4 is M, the total number N of anneal plans can be on the order of M!, greater than M! by one or more orders of magnitude, or lesser than M! by one or more orders of magnitude.

Each anneal plan may include all, or a subset of, the entire set of the annealable semiconductor chips 4 as target semiconductor chips. For example, the anneal plan including the first exemplary simulated path A in FIG. 3A includes all of the annealable semiconductor chips 4, and the anneal plan including the second exemplary simulated path B in FIG. 3B includes a subset of the annealable semiconductor chips. As used herein, a "target semiconductor chip" refers an annealable semiconductor chip that is identified as a chip on which a curative anneal is to be performed for the purpose of bringing an anneal-activated parameter within the target specification range. Each anneal plan sequentially lists the entire set of target semiconductor chips within the anneal plan in the order of planned irradiation sequence. The total number of the target semiconductor chips within each anneal plan can be equal to, or less than, the total number of the annealable semiconductor chips 4, i.e., M. Thus, a first subset of the anneal plans may include M annealable semiconductor chips 4 as a total set of the target semiconductor chips, a second subset of the anneal plans may include (M−1) annealable semiconductor chips 4 as a total set of the target semiconductor chips, a third subset of the anneal plans may include (M−2) annealable semiconductor chips as a total set of the target semiconductor chips, etc.

Each anneal plans includes a time-dependent location of a laser beam on the semiconductor substrate, which defines the simulated path of the laser beam as a function of time. Each anneal plan has a corresponding planned irradiation sequence for the target semiconductor chips within the anneal plan. Exemplary planned irradiation sequences marked as "A" or "B" are shown as directional lines passing through the target semiconductor chips in FIG. 2. The total number of anneal plans to be examined can be reduced by a predefined algorithm. For example, a predefined algorithm can define locate a shortest line that passes through a cluster of annealable semiconductor chips 4 that are adjoined to one another at sides of the annealable semiconductor chips 4 or at corners of the annealable semiconductor chips 4.

In the examples illustrated in FIGS. 3A and 3B, ten of the annealable semiconductor chips 4 are located as a cluster, and as such, an algorithm can be employed to include all, or at least some, of the ten annealable semiconductor chips 4 within a continuous anneal path. In an exemplary illustration, all anneal plans can include the ten annealable semiconductor chips 4 and selective include none, one, two, three, or all four of the remaining isolated annealable semiconductor chips 4.

For each sequence of target semiconductor chips, a simulated path for a laser beam to impinge onto the target semiconductor chips in the order listed within the sequence can be generated. Because the target semiconductor chips are ordered within each anneal plan, change of the order of irradiation with the laser beam within an anneal plan results in another anneal plan with the corresponding change in the simulated path for the laser beam.

In one embodiment, the simulated path can be generated in a manner that minimizes collateral exposure of in-specification semiconductor chips 8. A subset of the in-specification semiconductor chips 8 that are collaterally irradiated with the laser beam traveling along the simulated path of the anneal plan is herein referred to as a set of collaterally irradiated semiconductor chips 8a. The collaterally irradiated semiconductor chips 8a may be within the direct path of the laser beam, or may be within the area of the laser beam even if the center of the laser beam does not pass through the corresponding collaterally irradiated semiconductor chip 8a. Thus, each of the N anneal plans includes a simulated path for a laser beam to impinge on a corresponding set of target semiconductor chips and collaterally irradiated additional semiconductor chips during transit of the laser beam between target semiconductor chips within the corresponding anneal plan. Each set of target semiconductor chips as defined by an anneal plan is a subset selected from the total set of all annealable semiconductor chips 4, which is a set of all semiconductor chips in the semiconductor substrate having measured values for the anneal-activated parameter within the predetermined subset of out of specification ranges.

Figure 4:
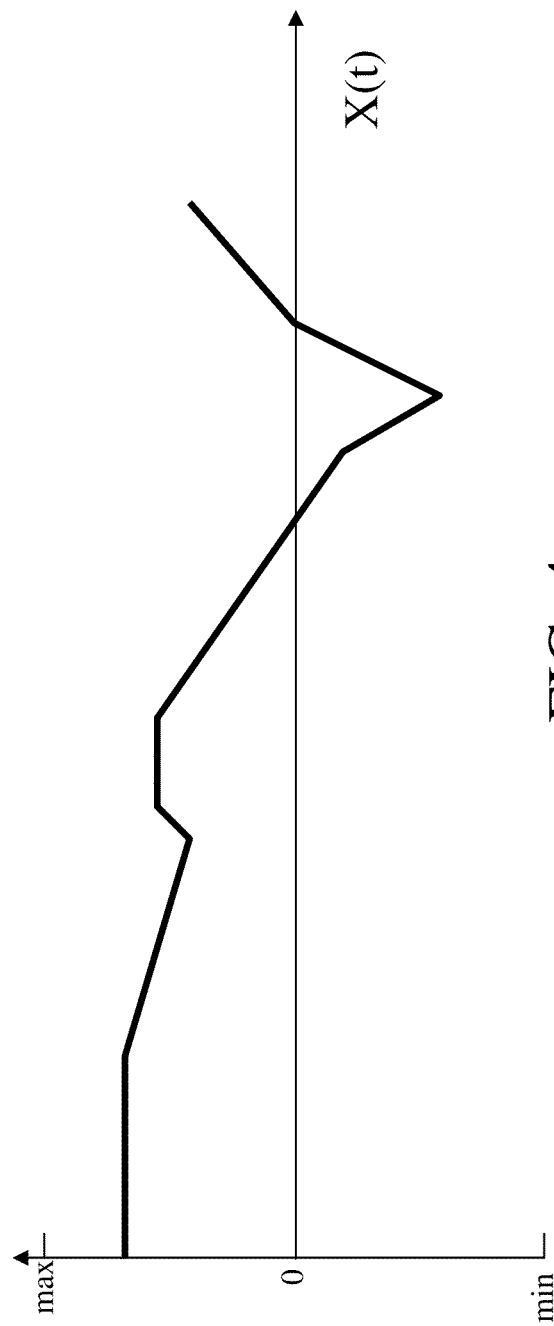
FIG. 4 illustrates an exemplary Cartesian x-coordinate function according to an embodiment of the present disclosure.

Referring to FIG. 4, the ordered set of target semiconductor chips within each anneal plan generates a corresponding beam path. For each beam path, a set of Cartesian coordinate functions representing the coordinates of the geometrical center of the laser beam as a function of time can be generated employing the automated program. In one embodiment, a constant scan speed can be imposed as a constraint to determine the set of Cartesian coordinate functions.

In another embodiment, the data of the measured values of the anneal-activated parameter can be analyzed to determine a desired beam "beam stay time" for each of the annealable semiconductor chips 4 can be determined. As used herein, a beam stay time refers to a duration of laser irradiation on a target semiconductor chip. Each beam stay time can be determined by comparison of the measured value of an anneal-activated parameter and the specification range for the anneal-activated parameter. For example, the beam stay time for each annealable semiconductor chip can be linearly, or non-linearly, proportional to the deviation of the measured value of the anneal-activated parameter and a center value of the target specification range for the anneal-activated parameter. An annealable semiconductor chip 4 having a marginal deviation from the target specification range may be assigned a minimal beam stay time, while another annealable semiconductor chip 4 having a significant deviation from the target specification range may be assigned a greater beam stay time.

Further, multiple anneal plans can be generated from an identical beam path by altering the beam stay time of the laser beam for each of the target semiconductor chips. Change of a beam stay time results in a change in the Cartesian coordinates of the center position of the laser beam as a function of time. Thus, each of the plurality of anneal plans includes a set of Cartesian coordinate functions for the center position of the laser beam on the semiconductor substrate 2 as a function of time. In one embodiment, each set of Cartesian coordinate functions can be contiguous and differentiable functions as a function of time to reflect the physical constraint of the laser beam moving continuously in space at a finite speed.

FIG. 4 illustrates an exemplary Cartesian x-coordinate function X(t) for an exemplary planned irradiation sequence.

FIG. 5 illustrates an exemplary Cartesian y-coordinate function Y(t) for the exemplary planned irradiation sequence.

Referring to FIG. 6, the semiconductor substrate 2 can be rotated during the laser irradiation in order to minimize the irradiation of the collaterally irradiated semiconductor chips 8a during the transit of the laser beam. The degree of rotation of the semiconductor substrate 2 can be parameterized with a substrate azimuthal angle function $\phi(t)$. Introduction of the substrate azimuthal angle function $\phi(t)$ can modify the corresponding Cartesian coordinate functions because rotation of the semiconductor substrate 2 modifies the Cartesian coordinates of the target semiconductor chips. In this case, each of the plurality of anneal plans can include a substrate azimuthal angle function $\phi(t)$ as a function of time. The substrate azimuthal angle function $\phi(t)$ represents an angular rotation of the semiconductor substrate 2 to assist a faster transit of the laser beam between target semiconductor chips to minimize exposure of the collaterally irradiated additional semiconductor chips 8a to the laser beam.

Referring to steps 140, 150, 160, and 170 in the flow chart 100 in FIG. 2, the computing means can be employed to simulate an estimated net yield enhancement for each of the plurality of anneal plans. The estimated net yield enhancement is the difference between the total number of estimated changes from an out of specification value to an in-specification value for the anneal-activated parameter less the total number of estimated changes from an in-specification value to an out of specification value for the anneal-activated parameter according to a corresponding anneal plan among the plurality of anneal plans.

Figure 7:
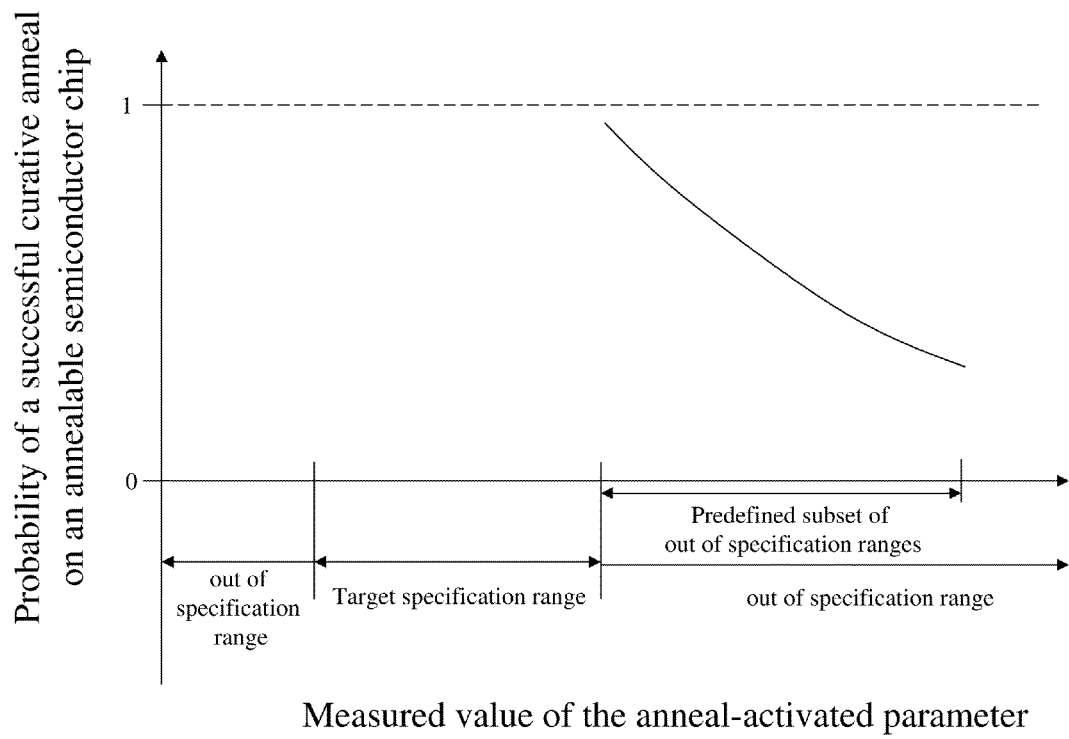
FIG. 7 illustrates an exemplary graph for the probability of a successful curative anneal on an annealable semiconductor chip.

The total number of estimated changes from an out of specification value to an in-specification value for the anneal-activated parameter is the expectation value for the total number of fixed chips derived from the target semiconductor chips, and is calculated by adding, for all target semiconductor chips within the corresponding anneal plan, the probabilities (as represented with a value from 0 to 1) for changing the value of the anneal-activated parameter from an out of specification value to a value within the target specification range for the anneal-activated parameter. The probabilities are summed up for each of the target semiconductor chips within the corresponding anneal plan. The probability for changing the value of the anneal-activated parameter from an out of specification value to a value within the target specification range can be calculated by an empirical formula empirically correlating (through prior experimentation) a statistical distribution of measured values for the anneal-activated parameter prior to the curative anneal and a statistical distribution of measured values for the anneal-activated parameter after the curative anneal. For any given out of specification value of the anneal-activated parameter as measured at a tester, the probability that the newly measured value of the anneal-activated parameter after the curative anneal would be within the specification range is the probability that an annealable semiconductor chip 4 with that value of the anneal-activated parameter would changing the value of the anneal-activated parameter to a value within the target specification range. FIG. 7 illustrates an exemplary graph for the probability of a successful curative anneal on an annealable semiconductor chip 4, i.e., the probability that a curative anneal would change the value of the anneal-activated parameter from an out of specification value to an in-specification value, as a function of the value for the anneal-activated parameter (as measured prior to the anneal at step 110 of flowchart 100).

Figure 8:
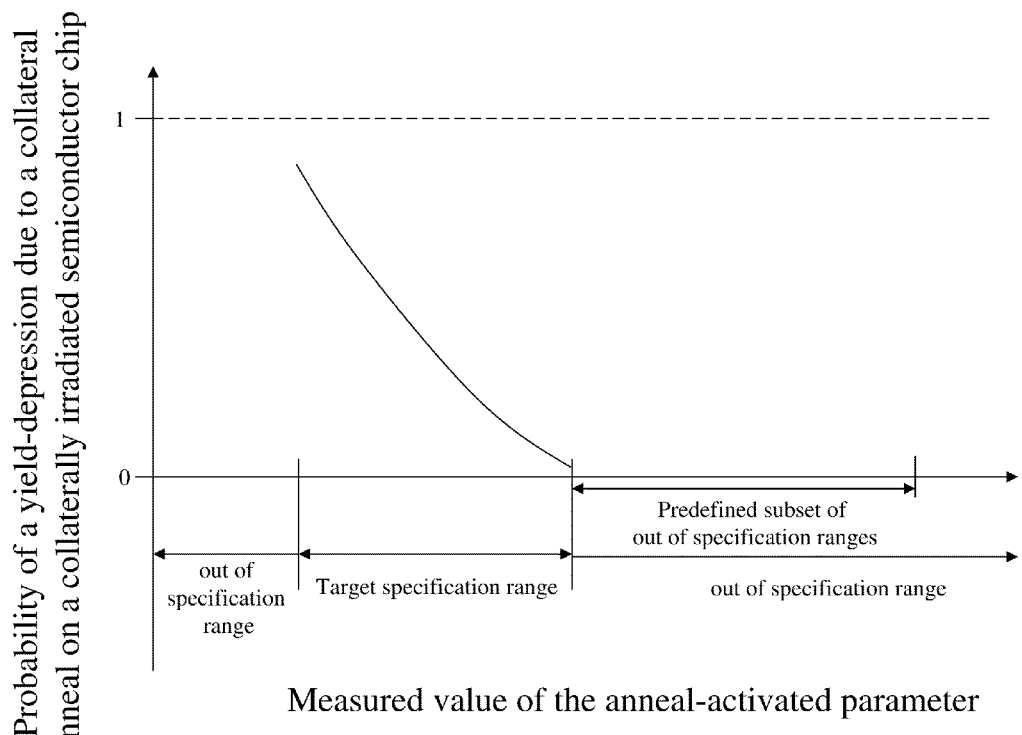
FIG. 8 illustrates an exemplary graph for the probability of a yield depression due to a collateral anneal on a collaterally irradiated semiconductor chip.

The total number of estimated changes from an in-specification value to an out of specification value for the anneal-activated parameter according to the corresponding anneal plan among the plurality of anneal plans is based on a simulated impact of the laser beam on in-specification semiconductor chips 8, i.e., the semiconductor chips that have in-specification measured values for the anneal-activated parameter, due to collateral irradiation during irradiation of a neighboring target semiconductor chip included within the corresponding anneal plan. In other words, the total number of estimated changes from an in-specification value to an out of specification value for the anneal-activated parameter is the expectation value for the total number of additionally generated out of specification chips derived from the collaterally irradiated semiconductor chips 8a, and is calculated by adding, for all collaterally irradiated semiconductor chips 8a within the corresponding anneal plan, the probabilities (as represented with a value from 0 to 1) for changing the value of the anneal-activated parameter from an in-specification value to a value outside the target specification range for the anneal-activated parameter. The probabilities are summed up for each of the collaterally irradiated semiconductor chips 8a within the corresponding anneal plan. The probability for changing the value of the anneal-activated parameter from an in-specification value to an out of specification value can be calculated by an empirical formula empirically correlating (through prior experimentation) a statistical distribution of measured values for the anneal-activated parameter prior to an intentionally induced collateral irradiation and a statistical distribution of measured values for the anneal-activated parameter after the intentionally induced collateral irradiation as performed in an experiment. For any given in-specification value of the anneal-activated parameter as measured at a tester, the probability that the newly measured value of the anneal-activated parameter (as measured after a collateral irradiation that would accompany the anneal plan under simulation) would be outside the specification range is the probability that a collaterally irradiated semiconductor chips 8a with that value of the anneal-activated parameter would changing the value of the anneal-activated parameter to a value outside the target specification range. FIG. 8 illustrates an exemplary graph for the probability of a yield depression due to a collateral anneal on a collaterally irradiated semiconductor chip 8a, i.e., the probability that a collateral anneal would change the value of the anneal-activated parameter from an in-specification value to an out of specification value for the anneal-activated parameter, as a function of the value for the anneal-activated parameter (as measured prior to the anneal at step 110 of flowchart 100).

In one embodiment, at least one anneal plan among the plurality of anneal plans may exclude at least one semiconductor chip from the set of annealable semiconductor chips 4, i.e., the set of all semiconductor chips in the semiconductor substrate 2 having measured values for the anneal-activated parameter within the predetermined subset of out of specification ranges. In one embodiment, an excluded semiconductor chip does not adjoin any semiconductor chip having an out of specification measured value for the anneal-activated parameter at sides or corners of the excluded semiconductor chip (as in the case of the last annealable semiconductor chip 4 to be irradiated according to the planned irradiation sequence A in FIG. 2).

The iterative performance of steps 140, 150, 160, and 170 in the flow chart 100 in FIG. 2 generates an estimated net yield enhancement for each of the plurality of anneal plans. Referring to step 180, the anneal plan that generates the greatest value for the estimated net yield enhancement can be determined. This anneal plan provides the greatest expectation value for the net improvement in the total yield.

In one embodiment, the anneal-activated parameter can be a sheet resistance of a metal silicide film. In another embodiment, the anneal-activated parameter can be a sheet resistance of a doped semiconductor material layer.

The lateral dimension of the laser beam for the purpose of the present disclosure can be greater than, the same as, or less than, the lateral dimension of a single semiconductor chip (4, 6, or 8). Thus, the methods of the present disclosure is not limited by the size of the laser beam to be employed provided that empirical correlation between irradiation and a shift in the anneal-activated parameter is empirically established for the in-specification semiconductor chips 8 and annealable semiconductor chips 4. As such, the present invention can be employed irrespective of the size of the semiconductor chips, and even for semiconductor chips smaller than the area of the laser irradiation, i.e., even in situations that collateral irradiation is an unavoidable consequence even for irradiation of a single semiconductor chip.

Figure 9:
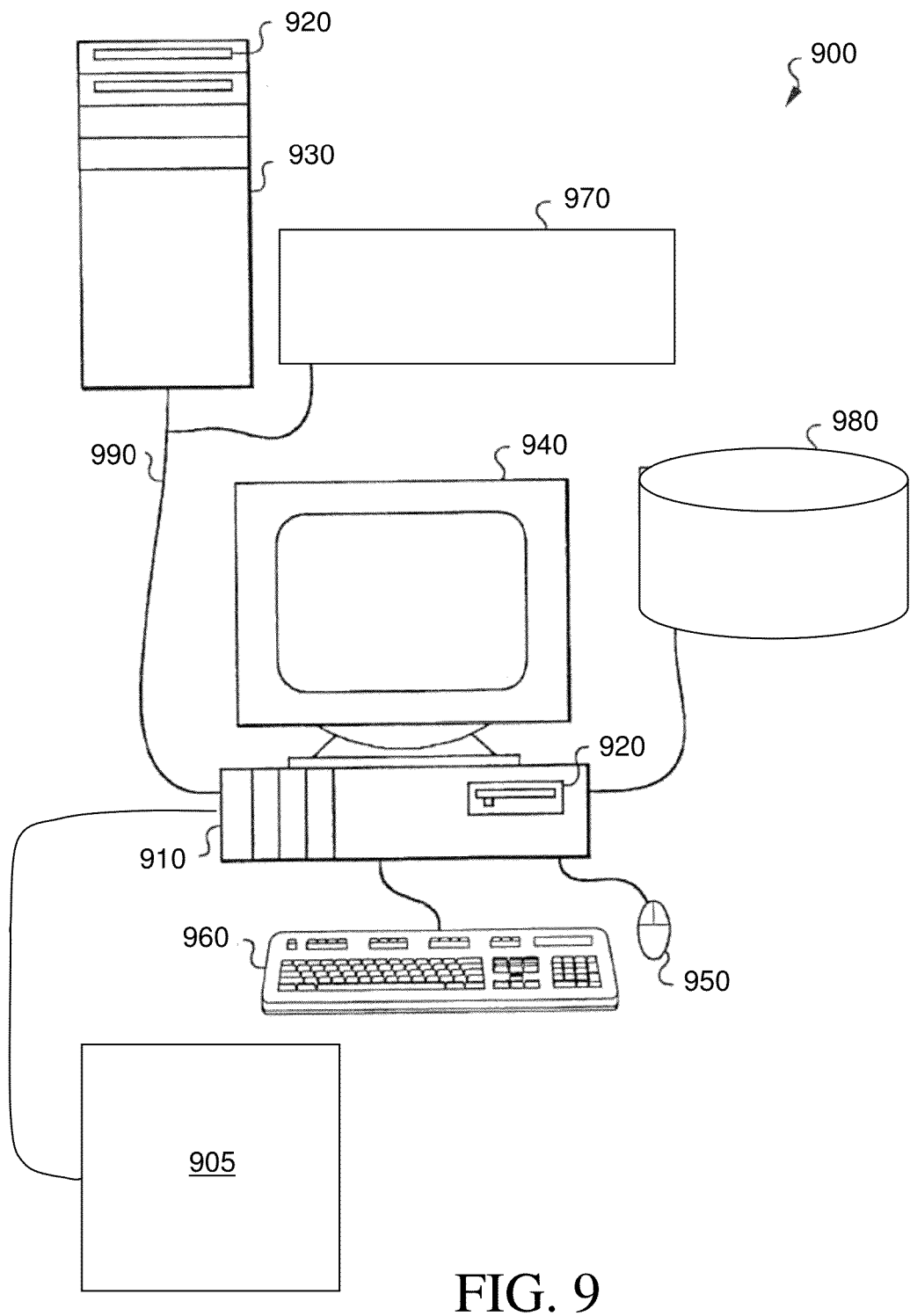
FIG. 9 is a schematic view of an exemplary system for implementing a method for determining an optimal anneal plan according to an embodiment of the present disclosure.

Referring FIG. 9, an exemplary system 900 is schematically illustrated for implementing a method for determining an optimal anneal plan according to an embodiment of the present disclosure. The exemplary system 900 can be employed to perform the various steps in the flow chart 100 of the present disclosure. The exemplary system includes a computing device that is configured to perform program instructions. The computing device can include a memory and a processor device in communication with the memory. The program instructions can configure the computing device to perform the steps of embodiments of the present invention described above. The exemplary system 900 can be a computer-based system in which the methods of the embodiments of the invention can be carried out by an automated program of machine-executable instructions to determine an optimal anneal plan.

A data storage device that is programmable and readable by a machine and tangibly embodying or storing a program of instructions that are executable by the machine to perform the methods described herein are also provided. For example, the automated program can be embodied, i.e., stored, in a machine-readable data storage devices such as a hard disk, a CD ROM, a DVD ROM, a portable storage device having an interface such as a USB interface, a magnetic disk, or any other storage medium suitable for storing digital data.

The computer-based system includes a processing unit 910, which is a computing device and houses a processor device, a memory and other systems components (not shown expressly in the drawing) that implement a general purpose or special purpose processing system, or computer that can execute a computer program product. The computer program product can comprise media, for example a compact storage medium such as a compact disc, which can be read by the processing unit 910 through a disc drive 920, or by any means known to the skilled artisan for providing the computer program product to the general purpose processing system for execution thereby. The exemplary system 900 can include a tester 970 that can test semiconductor substrates for an anneal-activated parameter. Alternately or additionally, a test database 980 that stores data for the anneal-activated parameter for the semiconductor substrate to be subsequently annealed within a laser anneal apparatus 905 can be external to the exemplary system 900 and electronically connected through a wired network or a wireless network.

The computer program product can comprise all the respective features enabling the implementation of the inventive method described herein, and which is able to carry out the method when loaded in a computer system. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer program product can be stored on hard disk drives within the processing unit 910, as mentioned, or can be located on a remote system such as a server 930, coupled to the processing unit 910, via a network interface such as an Ethernet interface 990 or wireless connection (not shown). A monitor 940, a mouse 950 and a keyboard 960 can be coupled to the processing unit 910, to provide user interaction.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of performing a laser anneal on a substrate including a plurality of semiconductor chips, said method comprising:
   providing data for in-substrate chip coordinates and measured values of an anneal-activated parameter for a plurality of semiconductor chips on a semiconductor substrate to a computing means, said computing means including one or more processors in communication with memory;
   generating a plurality of anneal plans for a laser anneal for said semiconductor substrate, each of said anneal plans including a simulated path for a laser beam to impinge on a corresponding set of target semiconductor chips and collaterally irradiated additional semiconductor chips during transit of said laser beam between target semiconductor chips, wherein each set of target semiconductor chips is a subset selected from a set of all semiconductor chips in said semiconductor substrate having measured values for said anneal-activated parameter within a predetermined subset of out of specification ranges;
   simulating, employing said computing means, an estimated net yield enhancement for each of said plurality of anneal plans, said estimated net yield enhancement being a difference between a total number of estimated changes from an out of specification value to an in-specification value for said anneal-activated parameter less a total number of estimated changes from an in-specification value to an out of specification value for said anneal-activated parameter according to a corresponding anneal plan among said plurality of anneal plans;
   determining an anneal plan that provides a greatest value for said estimated net yield enhancement; and
   controlling a laser anneal apparatus to perform said laser anneal on said substrate based on the anneal plan determined to provide the greatest value for said estimated net yield enhancement.

2. The method of claim 1, wherein each of said plurality of anneal plans includes a time-dependent location of a laser beam on said semiconductor substrate.

3. The method of claim 1, wherein each of said plurality of anneal plans includes a set of Cartesian coordinate functions for a center position of said laser beam on said semiconductor substrate as a function of time.

4. The method of claim 3, wherein said set of Cartesian coordinate functions are contiguous and differentiable functions as a function of time.

5. The method of claim 3, wherein each of said plurality of anneal plans includes a substrate azimuthal angle function as a function of time, said substrate azimuthal angle function representing an angular rotation of said semiconductor substrate to assist a faster transit of said laser beam between target semiconductor chips to minimize exposure of said collaterally irradiated additional semiconductor chips to said laser beam.

6. The method of claim 1, wherein at least one anneal plan among said plurality of anneal plans excludes at least one semiconductor chip from said set of all semiconductor chips in said semiconductor substrate having measured values for said anneal-activated parameter within a predetermined subset of out of specification ranges.

7. The method of claim 6, wherein an excluded semiconductor chip does not adjoin any semiconductor chip having an out of specification measured value for said anneal-activated parameter at sides or corners of said excluded semiconductor chip.

8. The method of claim 1, wherein said total number of estimated changes from an in-specification value to an out of specification value for said anneal-activated parameter according to said corresponding anneal plan among said plurality of anneal plans is based on a simulated impact of said laser beam on semiconductor chips that have in-specification measured values for said anneal-activated parameter due to collateral irradiation during irradiation of a neighboring target semiconductor chip included within said corresponding anneal plan.

9. The method of claim 1, wherein said anneal-activated parameter is a sheet resistance of a metal silicide film.

10. The method of claim 1, wherein said anneal-activated parameter is a sheet resistance of a doped semiconductor material layer.

11. A system for performing a laser anneal on a substrate including a plurality of semiconductor chips, said system comprising:
   computing means including one or more processors in communication with memory and configured to perform processing steps of:
   receiving data for in-substrate chip coordinates and measured values of an anneal-activated parameter for a plurality of semiconductor chips on a semiconductor substrate;
   generating a plurality of anneal plans for a laser anneal for said semiconductor substrate, each of said anneal plans including a simulated path for a laser beam to impinge on a corresponding set of target semiconductor chips and collaterally irradiated additional semiconductor chips during transit of said laser beam between target semiconductor chips, wherein each set of target semiconductor chips is a subset selected from a set of all semiconductor chips in said semiconductor substrate having measured values for said anneal-activated parameter within a predetermined subset of out of specification ranges;
   simulating an estimated net yield enhancement for each of said plurality of anneal plans, said estimated net yield enhancement being a difference between a total number of estimated changes from an out of specification value to an in-specification value for said anneal-activated parameter less a total number of estimated changes from an in-specification value to an out of specification value for said anneal-activated parameter according to a corresponding anneal plan among said plurality of anneal plans; and determining an anneal plan that provides a greatest value for said estimated net yield enhancement; and a laser anneal apparatus configured to perform said laser anneal on said substrate based on the anneal plan determined to provide the greatest value for said estimated net yield enhancement.

12. The system of claim 11, wherein each of said plurality of anneal plans includes a time-dependent location of a laser beam on said semiconductor substrate.

13. The system of claim 11, wherein each of said plurality of anneal plans includes a set of Cartesian coordinate functions for a center position of said laser beam on said semiconductor substrate as a function of time.

14. The system of claim 13, wherein said set of Cartesian coordinate functions are contiguous and differentiable functions as a function of time.

15. The system of claim 13, wherein each of said plurality of anneal plans includes a substrate azimuthal angle function as a function of time, said substrate azimuthal angle function representing an angular rotation of said semiconductor substrate to assist a faster transit of said laser beam between target semiconductor chips to minimize exposure of said collaterally irradiated additional semiconductor chips to said laser beam.

16. The system of claim 11, wherein at least one anneal plan among said plurality of anneal plans excludes at least one semiconductor chip from said set of all semiconductor chips in said semiconductor substrate having measured values for said anneal-activated parameter within a predetermined subset of out of specification ranges.

17. The system of claim 16, wherein an excluded semiconductor chip does not adjoin any semiconductor chip having an out of specification measured value for said anneal-activated parameter at sides or corners of said excluded semiconductor chip.

18. The system of claim 11, wherein said total number of estimated changes from an in-specification value to an out of specification value for said anneal-activated parameter according to said corresponding anneal plan among said plurality of anneal plans is based on a simulated impact of said laser beam on semiconductor chips that have in-specification measured values for said anneal-activated parameter due to collateral irradiation during irradiation of a neighboring target semiconductor chip included within said corresponding anneal plan.

19. The system of claim 11, wherein said anneal-activated parameter is a sheet resistance of a metal silicide film.

20. The system of claim 11, wherein said anneal-activated parameter is a sheet resistance of a doped semiconductor material layer.

* * * * *